United States Patent
Hagen et al.

(10) Patent No.: US 7,315,593 B2
(45) Date of Patent: Jan. 1, 2008

(54) HYPERFINE OVERSAMPLER METHOD AND APPARATUS

(75) Inventors: Michael S. Hagen, Vancouver, WA (US); Kevin C. Spisak, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 537 days.

(21) Appl. No.: 10/435,321

(22) Filed: May 9, 2003

(65) Prior Publication Data

US 2004/0223569 A1    Nov. 11, 2004

(51) Int. Cl.
   *H04L 7/00* (2006.01)
(52) U.S. Cl. .............. 375/355; 375/350; 700/73; 702/108
(58) Field of Classification Search ............ 375/354, 375/355, 377, 350; 700/73; 702/108, 121, 702/122, 182
See application file for complete search history.

(56) References Cited

U.S. PATENT DOCUMENTS

| | | | |
|---|---|---|---|
| 4,541,100 A * | 9/1985 | Sutton et al. | 375/224 |
| 5,144,525 A | 9/1992 | Saxe et al. | |
| 5,229,668 A * | 7/1993 | Hughes et al. | 327/271 |
| 5,521,946 A * | 5/1996 | Main | 375/350 |
| 5,526,286 A * | 6/1996 | Sauerwein et al. | 702/79 |
| 5,526,301 A | 6/1996 | Saxe | |
| 5,714,904 A * | 2/1998 | Jeong | 327/407 |
| 6,091,619 A | 7/2000 | Kogan | |
| 6,912,474 B2 * | 6/2005 | Richmond | 702/125 |

\* cited by examiner

*Primary Examiner*—Dac V. Ha
(74) *Attorney, Agent, or Firm*—Moser, Patterson & Sheridan, LLP; Thomas F. Lenihan

(57) ABSTRACT

A plurality of digital samplers operating on a common signal under test (SUT) sample the SUT at a sample rate beyond that which guarantees monotonic sampling and non-overlapping setup and hold windows for adjacent samplers. Subsequent processing of the sample streams restores monotonicity and sample independence to provide thereby a very high effective sample rate.

16 Claims, 4 Drawing Sheets

HYPERFINE OVERSAMPLER METHOD AND APPARATUS

FIELD OF THE INVENTION

The invention relates generally to digital data acquisition instruments such as logic analyzers and, more particularly, methods and apparatus employing asynchronous oversampling of input signals.

BACKGROUND OF THE INVENTION

Logic analyzers are digital data acquisition instruments that allow a user to acquire and analyze digital data from a large number of logic signals, such as all of the address, data and control signals associated with a microprocessor. Each logic signal is compared to a logic threshold or thresholds and results into one of two logic states, high or low, 1 or 0, true or false. The behavior of groups of these signals can then be monitored to analyze the behavior of the circuitry or instrument under test.

The time at which the state of the logic signals under analysis is resolved into binary form is determined by a clock signal. If this clock signal is generated by the logic analyzer and is independent of the system under test, the acquisition is said to be "asynchronous." If the clock signal is derived from the system under test so as to bear a predetermined timing relationship to part of the activity within that system, the acquisition is said to be "synchronous."

U.S. Pat. No. 5,526,286, issued Jun. 11, 1996, to Sauerwein et al. for "Oversampled Logic Analyzer" discloses a digital oversampling system and is incorporated herein by reference in its entirety. In the disclosed oversampled logic analyzer, all data and clock signal inputs are acquired asynchronously at high speed using a digital fast-in slow-out (FISO) acquisition circuit which produces a plurality of parallel high-speed data samples within each cycle of an internal system clock. The sample interval utilized is greater than the set up and hold time of the sampling device. Thus, the resulting samples are monotonic and statistically independent. In the disclosed oversampling system data and clock signals are sampled, thereby incurring sampling errors of ±1 sample interval. For example, in the case of a 125 picosecond sample interval (8 GHz oversampling), the theoretical best case setup and hold specification for such a system is two sample intervals or 250 picoseconds. However, this setup and hold specification is further degraded by sample position errors, calibration errors, random noise and other noise sources such that a useful measured value is produced at, approximately, a 500 picosecond sample interval range.

SUMMARY OF INVENTION

These and other deficiencies of the prior art are addressed by the present invention of a method and apparatus for oversampling of a digital data stream. The invention uses a nominal sample time resolution approaching a system noise floor, and a minimum pulse width capture approaching a setup and hold time of the sampler employed.

Specifically, the hyperfine oversampler (HFO) of the present invention samples a digital data signal at a sample rate beyond that which guarantees monotonic sampling and, further, beyond that which provides non-overlapping setup and hold windows for adjacent samplers. The effects of such hyperfine oversampling are compensated for by a statistical processing or filtering method in which the logical state of each sample is determined using a summation of the weighted values of adjoining samples.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of a logic analyzer (LA). However, it will be appreciated by those skilled in the art that the invention may be advantageously employed in any single-channel or multiple-channel signal measurement or analysis device, such as a digital storage oscilloscope (DSO), in which one or more digital input signals are periodically sampled to ascertain changes in logic level over time.

The invention provides apparatus and methods for sampling digital data targeted at very small setup and hold applications. This invention samples digital data steams with a nominal time resolution that approaches a noise floor of a system (e.g., 10's of picoseconds) and a minimum pulse width capture that approaches the setup and hold SU&H of the sampler (e.g., 100 ps). Optionally, selectable parameters are included that allow tradeoffs to be made between minimum pulse width capture and noise immunity parameters.

Generally speaking, the hyperfine oversampler (HFO) of the present invention provides increased timing resolution by increasing the sample rate beyond the limit imposed by monotonic sampling in a noisy environment. The HFO samples do not provide a simple record of the input signal, though they are rich in information due to the density of the samples. To recover an accurate representation of the acquired signal, the high frequency components of the relatively noisy sampling process are eliminated. This elimination is achieved substantially in real-time by incorporating a digital low pass filter. By reducing the sampling noise by, for example, a factor of three, mean sample resolutions of approximately 20 picoseconds are achieved as described herein. The 20 picosecond limit is based upon current complementary metal oxide semiconductor (CMOS) process technology. As such, process technology advances and the use of other promising technologies will enable the invention to reduce the mean sampling resolution to well below 20 picoseconds.

Figure 1:
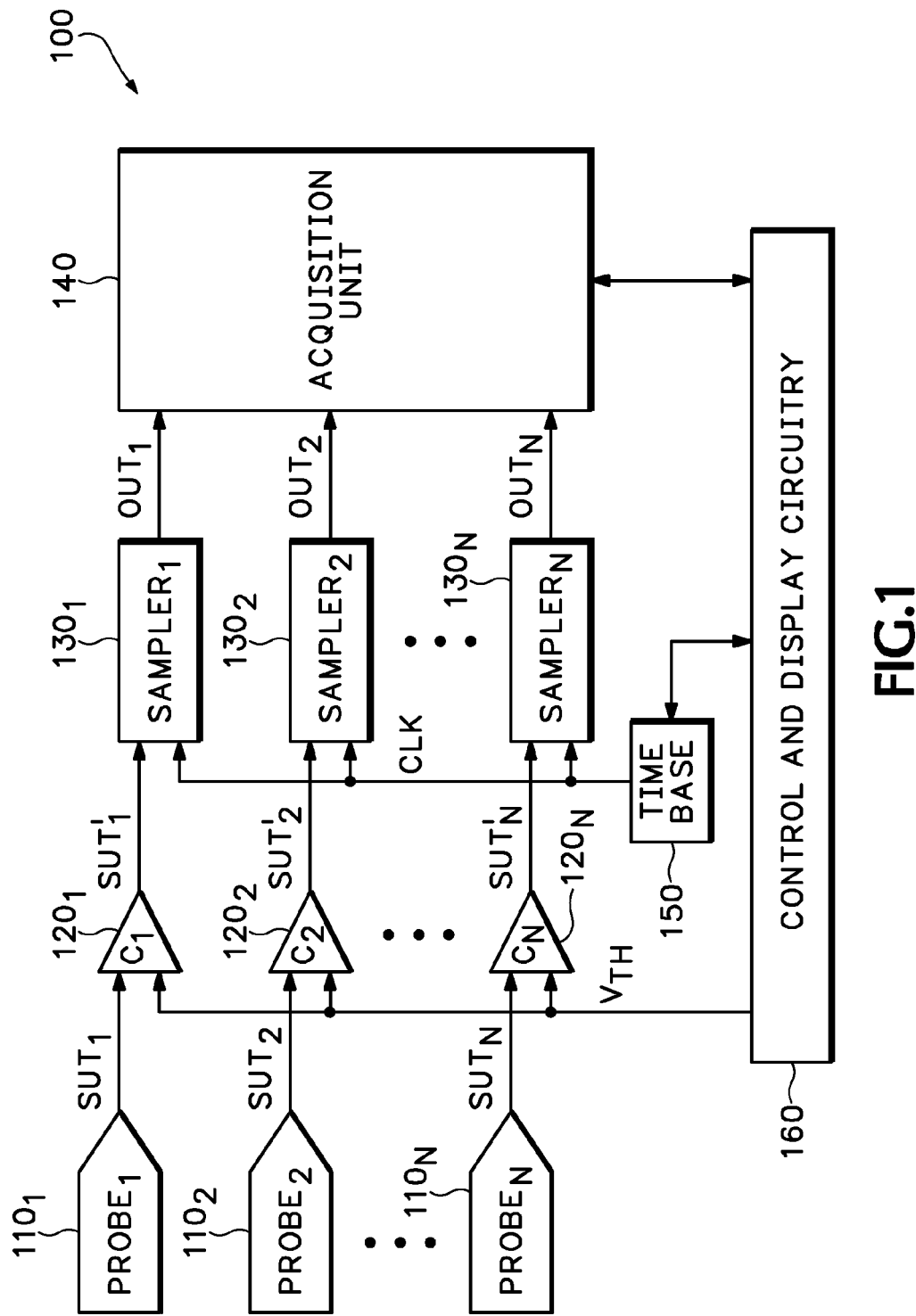
FIG. 1 depicts a high level block diagram of a logic analyzer according to an embodiment of the present invention.

FIG. 1 depicts a high level block diagram of a portion of a signal acquisition system 100 according to an embodiment of the present invention. Specifically, each of a plurality of probes $110_1$ through $110_N$ (collectively probes 110) provides a respective signal under test ($SUT_1$-$SUT_N$) to a respective comparator 120. Each of the comparators 120$_1$ to 120$_N$ (collectively comparators 120) compares its respective SUT to a threshold voltage level V$_{TH}$ to produce a corresponding output signal SUT' having a first voltage level representing a low logic state and a second voltage level representing a high logic state.

Each of a plurality of samplers 130$_1$ through 130$_N$ (collectively samplers 130) receives the output signal SUT' from a respective comparator 120. Each of the samplers 130$_1$ samples and filters its respective received signal SUT' according to a clock signal CLK to produce a respective sampled output stream OUT. Each of the plurality of output streams OUT$_1$ through OUT$_N$ (collectively output streams OUT) are coupled to an acquisition unit 140. The acquisition unit 140 includes memory and other circuitry adapted to receiving and processing the sample streams OUT provided by the samplers 130. Within the context of the present invention, the samplers 130 are perfectly implemented as hyperfine oversamples (HFOs), which are described in more detail below.

A time base 150 is used to provide the clock signal CLK to the samplers 130. Control and display circuitry 160 generates the voltage threshold signal V$_{TH}$, controls the time base 150, interacts with the acquisition unit 140 and otherwise provides input processing, output/display processing and control processing to the logic analyzer 100 of FIG. 1. It will be appreciated by those skilled in the art that various known portions used to implement a logic analyzer have been omitted to avoid distracting the reader from the present invention.

Figure 2:
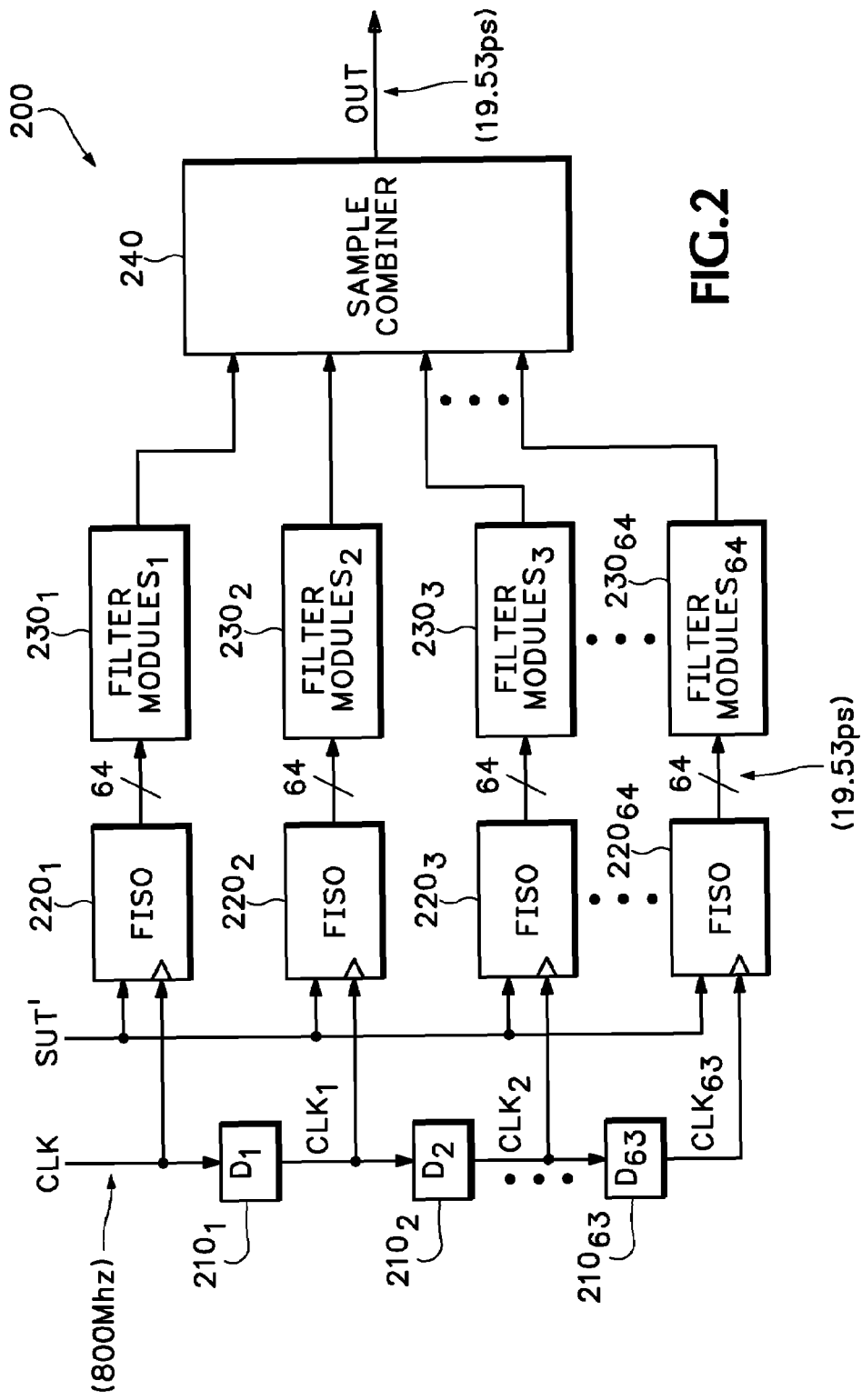
FIG. 2 depicts a high level block diagram of a sampler suitable for use in the system 100 of FIG. 1.

FIG. 2 depicts a high level block diagram of a sampler suitable for use in the system 100 of FIG. 1. Specifically, FIG. 2 depicts a high level block diagram of a hyperfine oversampler (HFO) 200 suitable for use in realizing one or more of the samplers 130 of the system 100 of FIG. 1. The sampler 200 of FIG. 2 receives an input signal SUT' and a clock signal CLK. The sampler 200 samples and filters the input signal SUT' to produce a sampled output stream OUT.

The sampler 200 comprises a plurality of delay elements 210$_1$ through 210$_{63}$ (collectively delay elements 210), a plurality of fast in slow-out (FISO) acquisition circuits 220$_1$ through 220$_{64}$ (collectively FISOs 220), a plurality of filter modules (FM) 230$_1$ through 230$_{64}$ (collectively filter modules 230) and a sample combiner 240. The sampler 200 of FIG. 2 is depicted as comprising 64 processing stages, where each stage comprises a corresponding FISO 220 and FM 230. Moreover, each stage is clocked in a time-staggered manner such that, in the embodiment of FIG. 2, the clock signals applied to each stage are offset in time with respect to adjacent stages by $\frac{1}{64}^{th}$ of the period of the clock signal CLK. It will be appreciated by those skilled in the art that more or fewer stages may be employed within the context of the present invention. Thus, the sixty four stage embodiment depicted in FIG. 2 is to be interpreted as merely illustrating the present invention, not as limiting the invention to a sixty four stage embodiment.

The clock signal CLK is provided to the first FISO 220$_1$ and first delay element 210$_1$, which in turn provides a clock signal CLK$_1$ delayed in time by one sixty fourth ($\frac{1}{64}$) the period of the input clock signal CLK to the second FISO 220$_2$ and the second delay element 210$_2$ (and so on up to the last FISO 220$_{64}$ and the delay element 210$_{63}$). Thus, the delay elements 210$_1$ through 210$_{63}$ are arranged in a cascaded manner such that each delay element 210$_1$ through 210$_{63}$ produces a respective clock signal which is delayed in time by one delay period with respect to the preceding delay element. Each of the original (CLK) and delayed (CLK$_1$-CLK$_{63}$) clock signals is provided to a respective FISO 220. It will be appreciated by those skilled in the art that while the delay elements 210$_1$ to 210$_{63}$ are depicted as a cascade series of delay elements, a single timing controller may be implemented to provide the phase-staggered clock signals appropriate to the present invention.

The fast-in slow-out (FISO) circuits 220 in one embodiment resemble FISOs described in U.S. Pat. No. 5,144,525 to Saxe et al. for "Analog Acquisition System Including A High Speed Timing Generator," which is incorporated herein by reference in its entirety. Briefly, the '525 patent discloses an analog acquisition system including an array of analog capture cells for capturing and storing a signal on an analog bus. Each capture cell in the array may be sequentially selected for sampling the signal at successive sample times. Timing for selecting a row of the analog memory array is provided by a slow shift register and timing for selecting a capture cell within the row of the analog memory array is provided by a fast tapped delay line. Additional circuitry is provided for controlling the delay of the tapped delay line such that the total delay is equal to the time the slow shift register takes to transfer from one row to the next. The FISO of the '525 patent is modified within the context of the subject invention to contain flip-flops as digital storage elements, rather than the analog storage cells described in the '525 patent. Specifically, the FISO of the present invention is preferably realized in the manner described in U.S. Pat. No. 5,526,286 to Sauerwein et al., which is incorporated herein by reference in its entirety. Briefly, in the present embodiment of the FISO circuit 220, the FISO samples according to an oversampling factor M having a value of, illustratively, 64 in the particular implementation shown. The output of the FISO 20 is 64 bits of parallel high-speed data samples synchronized to, illustratively, an 800 MHz internal clock CLK. This 64-bit parallel high-speed sample is applied to the input of corresponding filter module 230. The FISOs 220 may be implemented using arrays of D-type or other flip-flop devices.

The FISO circuits 220 produce respective pluralities of parallel high-speed data samples within each cycle of an internal system clock. In the exemplary embodiment of FIG. 2, each FISO 220 produces 64 parallel high-speed data sample streams within each cycle of the internal clock. For purposes of discussion, it is assumed that each of the 64 samples is acquired during a 100 picosecond set up and hold time, and that the start of the acquisition of adjacent samples is offset in time by 19.53 picoseconds. Therefore, each set up and hold time for any one sample overlaps the set up and hold times for three temporally proceeding samples and three temporally following samples. An example will now be described with respect to FIG. 4.

Figure 4:
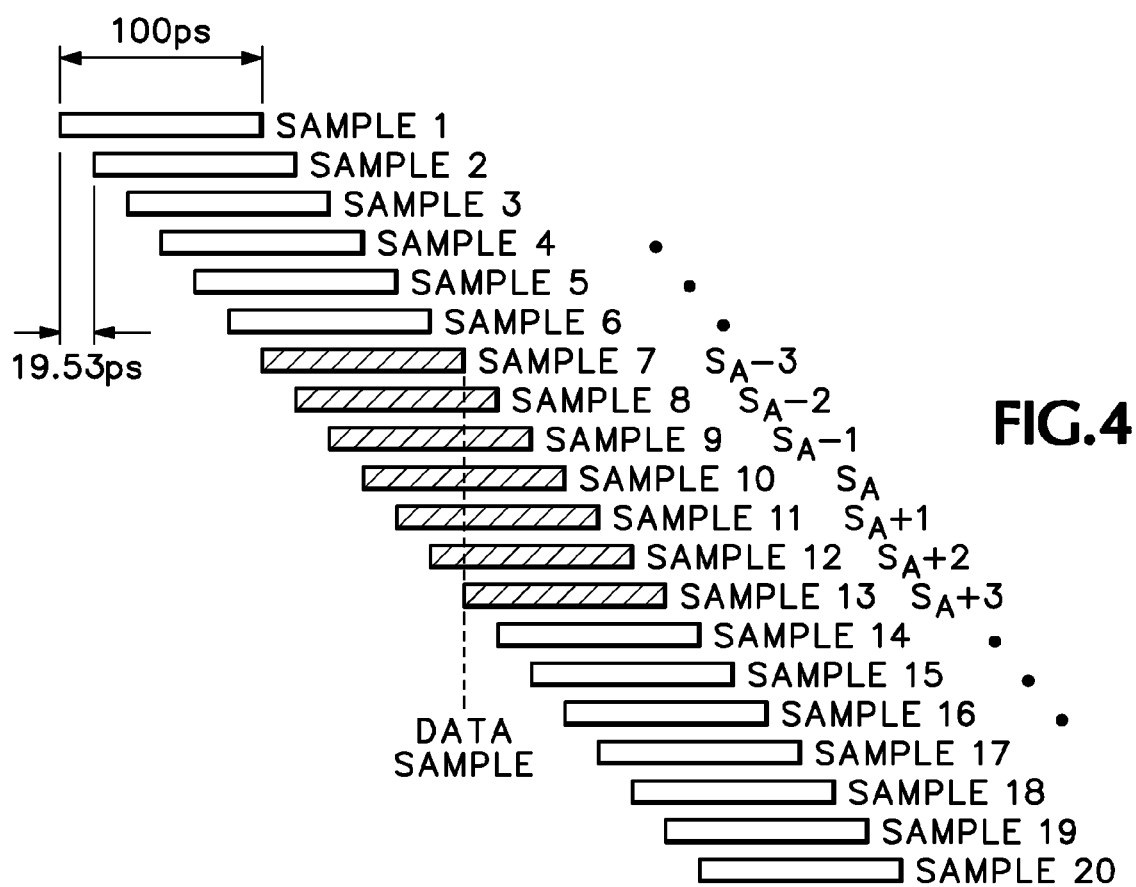
FIG. 4 depicts a graphical representation useful in understanding the present invention.

FIG. 4 depicts a graphical representation of a sample set useful in understanding the present invention. Specifically, FIG. 4 depicts a plurality of samples (illustratively twenty samples from a sixty four sample system) denoted as sample 1, sample 2 and so on up to sample 20. Each of the samples has associated with it a respective set up and hold (SU&H) time of 100 picoseconds. The start of the SU&H time associated with each sample is offset from the start of the corresponding time of adjacent samples by 19.53 picoseconds. The tenth sample (S10) is depicted as darkly shaded, indicating that the tenth sample is presently subjected to a filtering operation directed toward correcting any errors within the tenth sample. The three preceding samples (S7, S8, S9) and three following samples (S11, S12, S13) along with the tenth sample S10 are depicted in lighter shading, indicating that these samples are presently subjected to the same filtering operation though at lower weights. That is, the HFO filter is implemented as a weighted average of the time adjacent samplers. With respect to FIG. 4, it is noted that the set up and hold times of samples S7 through S13 at least partially overlap. Therefore, the sample S7 through S13 are processed in a weighted manner to provide a statistically likely result for the middle sample S10. Each of the 20 depicted samples S1 through S20 is filtered by a corresponding filter which provides a greater weight to the center sample and lesser weights to each of a plurality of surrounding samples (illustratively three samples preceding and three samples following in time).

Referring now to FIG. 2, each of the filter modules 230 receives 64 samples each clock cycle from its respective FISO 220. Each of the filter modules 230 comprises a plurality (illustratively 64) of finite impulse response (FIR) filters implementing a predetermined or selectable filtering algorithm, such as box-car filtering algorithm, a weighted filtering algorithm and the like. Preferred filtering techniques will be described in more detail below with respect to FIG. 3. Briefly, in one embodiment of the invention, a $$\frac{SINX}{X}$$

or SINC filtering technique is used and, in various embodiments, different weighting of filter coefficients are employed. Embodiments of filters with 5, 7 and 9 coefficients will be discussed, though more or fewer coefficients may be used.

The sample combiner 240 receives the 64 filtered sample streams produced by each of the filter modules 230 and combines the various sample streams to produce a corresponding output stream OUT. In one embodiment, the sample combiner 240 comprises a sample interleaver that operates to interleave the phase-staggered filtered sample streams produced by the filter modules 230 to provide a serial data output stream OUT. In another embodiment, the sample combiner 240 comprises a linear chain of, illustratively, 64 delay elements temporally separated by, illustratively, 19.53 picoseconds (1250 ps/64). In either case, the serial data output stream OUT depicts logic transitions on the input signal SUT to a very high degree of accuracy.

The sampler 200 of the present invention utilizes, illustratively, a system clock CLK having a frequency of 800 MHz (1.25 nanosecond period) and an effective periodic sample rate of 51.2 GHz (19.53 ps sample period). At this sample rate, the illustrative 100 ps SU&H time for each FISO sampler overlaps that of the previous 3 samplers and the following 3 samplers and is not statistically independent of its neighbor. Assuming a uniform probability distribution (a reasonable simplified first order approximation of the actual probability distribution), if a sampler sees a logic 1 there is a 85% chance that the adjacent sampler will also see a logic 1 and a 70% chance that the sampler two time intervals away will also see a logic 1. The actual probability distribution is likely to be non-uniform.

This structure is susceptible to several significant errors. First, it is unlikely that any implementation of the oversampler will be able to place each sampler at the correct time position, resulting at times in a non-monotonic data series. A second error will result from system noise. Even if adjacent samplers are correctly sequenced in time, each sampler will be subject to a slightly different noise environment. This local noise susceptibility will dynamically offset the time position of the sampler and may cause temporary time reversals. The noise may be internal to the various samplers (e.g., due to the fabrication technologies employed), or imparted to the signal under test prior to processing by the samplers. A third source of error is the time required for the sampler to realize the input signal (SU&H). Each sampler will contain biases due to its construction and placement that will affect its SU&H window. Further, each sampler will be susceptible to inter-symbol interference. A sampler that contained a logic 1 will require more time to capture a following logic 0 than to capture another logic 1.

Because of the errors described above, the actual time position of a particular sample taken during an acquisition is not known with absolute accuracy. Within the context of the present invention, the sample time position is primarily described as a probability curve. It is very likely that the time position of a given sample is close to its first-order design time but there is a decreasing likelihood that it is displaced in time. A hardware filter (i.e., FM 230) addresses these second-order effects and rebuilds an accurate representation of the input signal.

Figure 3:
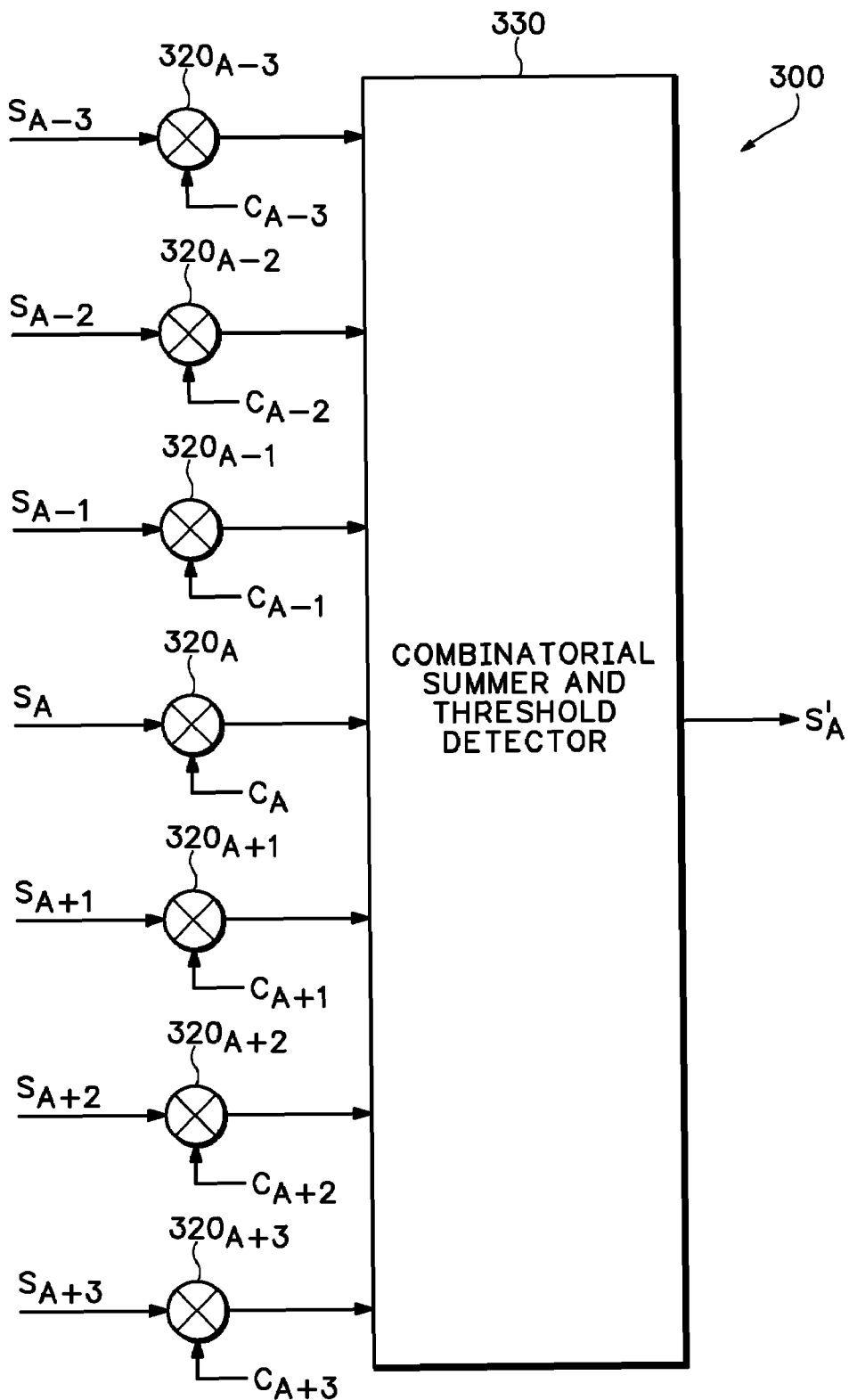
FIG. 3 depicts a high level block diagram of a filter suitable for use within the sampler of FIG. 2.

FIG. 3 depicts a high level block diagram of a digital filter according to an embodiment of the present invention. Specifically, the filter 300 of FIG. 3 comprises an FIR filter that is suitable for use in implementing each of the plurality of sub-filters forming each of the filter modules 230 of FIG. 2. That is, each of the filter modules 230 of FIG. 2 comprises, illustratively, 64 filters such as filter 300, where each of the 64 filters is used to process a respective one of the 64 sample streams provided by the corresponding FISO 220. The filter 300 of FIG. 3 is shown and discussed within the context of a seven coefficient FIR filter. However, as will be discussed in more detail below, five, nine and other numbers of coefficients may be employed. Moreover, in one embodiment of the invention, the filter 300 may include multiple filter configurations (e.g., 5-, 7- and 9-coefficient configurations) which share portions of their circuitry and which may be selectively employed given the nature of the noise encountered in the system of the desires of a user.

Assuming that a particular digital filter 300 is processing a sample $S_A$ (e.g., sample S10 of FIG. 4), the received sample $S_A$ is multiplied by a coefficient $C_A$ using a multiplier $320_A$. Similarly, each of the (illustratively) three samples preceding sample A ($S_{A-1}$, $S_{A-2}$ and $S_{A-3}$) are provided to respective multipliers $320_{A-1}$, $320_{A-2}$ and $320_{A-3}$, where the samples are multiplied by, respectively, coefficients $C_{A-1}$, $C_{A-2}$ and $C_{A-3}$. Similarly, each of the (illustratively) three samples following sample A ($S_{A+1}$, $S_{A+2}$ and $S_{A+3}$) are provided to respective multipliers $320_{A+1}$, $320_{A+2}$ and $320_{A+3}$, where the samples are multiplied by, respectively, coefficients $C_{A+1}$, $C_{A+2}$ and $C_{A+3}$. The output from each of the multipliers $320_{A-3}$ through $320_{A+3}$ is coupled to a combinatorial summer and threshold detector 330.

The combinatorial summer and threshold detector 330 produces an utput signal $S'_A$ which, in the case of a logic analyzer, is either a 1 or a 0. Depending upon the weighting algorithm selected (i.e., the values of $C_{A-3}$ through $C_{A+3}$), as well as the number of terms selected (seven terms are shown here) to correct any one sample, the combinatorial summer compares the added values to a threshold value to determine whether a logic level is achieved. For example, in one embodiment of the invention, the coefficients of $S_{A-3}$ through $S_{A+3}$ are, respectively, 1, 3, 5, 5, 5, 3, 1. In this embodiment, if the combinatorial summer produces a result greater than or equal to 12, it is assumed that the sample $S'_A$ is equal to 1. Otherwise, it is equal to 0.

In the embodiment of FIGS. 3-4, up to seven HFO samplers are affected by the data input at any point in time. Of these 7 samplers (1-2-3-4-5-6-7) the fourth sampler is nominally best aligned to capture its respective data.

Generally speaking, the filter is implemented as a weighted average of the time adjacent samplers. In the current description seven samplers are statistically dependent so the average includes, for example, 7 temporally adjacent samples (1-2-3-4-5-6-7). Because it is more likely that the middle sample represents the actual data, the middle sample (4) is be given the greatest weight. The most distant samples (1 and 7) is be given the least weight. The weighting should reflect the true probability distribution of the samplers to provide the highest fidelity result. However, it may be advantageous to include several different selectable weighting systems to tune the HFO performance to specific tasks.

The output value of the filter is determined by comparing the sum of weight value multiplied by the sample value (logic 1 or logic 0) with a predetermined threshold. If the sum is above the threshold, the data at this point in time is a logic 1 otherwise it is a logic 0. Several different weighting schemes will be described in the following paragraphs.

In an alternate filter embodiment, rules about what transitions are possible given a logic signal that precedes it are applied. The sampling system is bandwidth limited and there is some minimum period of time between adjacent rising or falling edges that can occur. These rules are applied to the data stream to eliminate time reversals and statistical dependence. The benefits of noise reduction through averaging are not realized by this solution but the resulting logic structure may be simpler. An example set of rules are: (1) The filter must not change any sample that could have met the SU&H criteria; (2) The time distance between same (i.e. rising to rising) edges must be greater than twice the SU&H window; and (3) The number of filtered edges must the same as the number of input edges.

The Hyperfine oversampler of the present invention overcomes several problems with a classical sequential oversampler. The most striking is the reduction of the ±1 sample error. This error still exists but is reduced to the maximum distance between two HFO samplers. The nominal value for the described system is a reduction from ±1250 ps for the classical case to ±19.3 ps for the HFO. The HFO filter has the additional benefit of noise reduction as a result of the averaging of statistically dependent data.

The HyperFine FIR filter is generally constructed by combining 5, 7, or 9 adjacent samples. These samples establish a time delayed set. Multiplier coefficients are applied to each sample in the set and the results summed. Because the desired output is a digital value, the sum is compared with a threshold value that represents the 50% output level. If the sum is greater than the threshold, the output is set high otherwise it is set low.

Actual construction of the filter involves several compromises to minimize the complexity of the implementation. The number of terms used is limited. The scaling coefficients are small positive integers. The sum is not directly implemented. Instead, combinatorial logic inspects the coefficients that have been triggered (are high) by the delayed input signals to determine if that combination exceeds the threshold value.

There are several standard FIR filter configurations that will produce a suitable low pass filter. For application to the Hyperfine oversampler, the inventor has explored, for example, boxcar and low pass filter configurations. Various digital simulations assumed a maximum distance of sample reversal to be 3 samples corresponding to a time displacement noise level of ±60 ps.

A boxcar filter is desirable because all scaling factors are 1. This reduces the logic required for implementation. Simulation of a 7 term filter indicated that some 3 sample time reversals are incorrectly passed on. The minimum pulse width accepted as data is 80 ps. A 9 term boxcar filter eliminated all sensitivity to 3 sample time reversals but increased the minimum passed pulse to 100 ps. A boxcar filter produces a trapezoidal transient response. The noise gain of this filter is constant over the transient period. Sensitivity to large distance sample reversals is most affected by the outside coefficients and minimum passed pulse by the middle coefficients. By increasing the middle and reducing the outside coefficients, better filter performance can be achieved.

A low pass filter with non-uniform coefficients is also appropriate. The low pass filter coefficients provide a transient response that rises slowly at first but increases rapidly at the 50% point. A set of coefficients were arrived at empirically by observing the frequency and time domain performance of various configurations that met the constraints described above. Excellent performance may be obtained with the following coefficients: [1, 3, 5, 3, 1], [1, 3, 5, 5, 5, 3, 1], and [1, 3, 5, 5, 5, 5, 5, 3, 1] using 5, 7, and 9 terms respectively. Each of these filters provided a range of desirable characteristics. The similarity of the three low pass filters provides an opportunity to include all three into a single implementation. In this manner, tuning of the front end characteristics to address the actual noise level of the chip or to provide application specific performance to the customer if the noise level of the implementation can be kept low enough.

Both the boxcar and low pass filters provide significant reduction in edge timing distortion. Digital simulations show that various 3 location reversals produce either single sample or no edge time displacements.

The cost of filter implementation (in gate count) is a critical concern. In one embodiment, each logic analyzer channel implementing the HyperFine oversampler produces 64 outputs. Each output must include a filter. Twenty to fifty two-input gates are required to implement each filter, or 1000-3000 gates. To implement 34 channels therefore consumes 110K gates. Although this is a large number of gates it is not outside of the capabilities of the CMOS technology under consideration.

The Hyperfine oversampling approach provides several benefits. First, it reduces the penalty of the 2 sample penalty of the oversampling approach. Second, a time resolution better than the noise limit can be achieved by careful design of the HyperFine filter. Third, by implementing several filter designs, signal performance can be tuned to provide either the highest possible performance or higher immunity to noise on the users signal.

The invention has been primarily described within the context of a 64-stage, one phase embodiment where 64 FISO/Filter Modules process respective time-staggered portions of a SUT. It will be appreciated by those skilled in the art and informed by the teachings of the present invention that more or fewer stages may be used within the context of the single phase embodiments of the invention. It is also noted that more phases may be used, where each phase comprises a plurality of stages and their respective output data are further phase interleaved to provide an ultimate output data stream. For example, a 20-stage, four phase embodiment has been utilized by the inventors in which temporal offsets for sample windows are 15.6 ps (rather than the 19.53 ps).

While the foregoing is directed to the preferred embodiment of the present invention, other and further embodiments of the invention may be devised without departing from the basic scope thereof, and the scope thereof is determined by the claims that follow.

What is claimed is:

1. Apparatus, comprising:
a plurality of samplers having temporally staggered and overlapping setup and hold windows, for sampling a common signal under test (SUT) to produce a corresponding plurality of temporally staggered sample streams; and
a plurality of digital filters, for filtering said temporally staggered sample streams in a manner tending to restore sample stream monotonicity and sample independence, wherein:
each of said samplers comprises a respective fast-in slow-out (FISO) circuit operative to sample said SUT during a respective time period established by a respective clock signal, each respective clock signal being delayed in phase with respect to adjacent clock signal by an amount of time determined according to the number of samplers used.

2. The apparatus of claim 1, further comprising:
a plurality of delay elements arranged in a cascade manner wherein a first delay element receives a system clock signal, each of said delay elements producing a respective phase delayed clock signal adapted for use by a corresponding FISO circuit.

3. The apparatus of claim 1, wherein:
each of said FISO circuits comprises an array of analog capture cells that are sequentially selected to capture and store respective portions of said SUT.

4. The apparatus of claim 1, wherein:
each of said FISO circuits comprises an array of digital storage elements that are sequentially selected to capture and store temporally respective portions of said SUT.

5. The apparatus of claim 4, wherein:
said digital storage elements comprise flip-flops.

6. The apparatus of claim 1, wherein:
each of said plurality of filters comprises a finite impulse response (FIR) filter for weighting each of samples from a respective sample stream and a plurality of temporally adjacent sample streams to provide a summed output, wherein said respective sample stream comprises a first logic level in response to said summed output exceeding a threshold level.

7. The apparatus of claim 6, wherein:
said plurality of filters comprise at least one of boxcar averaging filters and low pass filters.

8. The apparatus of claim 7, wherein said low pass filters comprise multiple stage low pass filters having non-uniform coefficients.

9. The apparatus of claim 1, further comprising:
a sample combiner, for combining said filtered sample streams to produce an output sample stream.

10. The apparatus of claim 9, wherein:
said sample combiner comprises one of a sample interleaver and a linear chain of delay elements.

11. The apparatus of claim 9, further comprising:
an acquisition unit, for acquiring output streams from each of a plurality of sample combiners, each of said sample combiners having associated with it a respective plurality of samplers and filters to implement thereby respective input channels in a logic level acquisition device.

12. A logic level acquisition device, comprising:
at least one input channel for sampling a signal under test (SUT) to determine logic level transitions, each of said at least one input channel comprising:
a comparator, for converting said SUT into a logic level indicative signal;
a plurality of samplers having temporally staggered and overlapping setup and hold windows, for sampling said logic level indicative signal to produce a corresponding plurality of temporally staggered sample streams;
a plurality of digital filters, for filtering said temporally staggered sample streams in a manner tending to restore sample stream monotonicity and sample independence; and
a sample combiner, for combining said filtered sample streams to produce an output sample stream; wherein
each of said temporally staggered and overlapping setup and hold windows comprise respective time periods established by a respective clock signal, each respective clock signal being delayed in phase with respect to an adjacent clock signal by an amount of time determined according to the number of windows used.

13. The logic level acquisition device of claim 12, further comprising:
an acquisition unit, for acquiring output streams from each of said at least one input channels.

14. A method, comprising the steps of:
sampling a signal under test (SUT) during each of a plurality of temporally staggered and overlapping setup and hold windows to produce a corresponding plurality of temporally staggered sample streams;
filtering each of said temporally staggered sample streams in a manner tending to restore sample stream monotonicity and sample independence; and
combining said filtered sample streams to produce an output sample stream: wherein
said step of combining comprises interleaving said plurality of filtered sample streams according to respective temporal slots defined by respective clock signals.

15. The method of claim 14, further comprising the step of:
acquiring a plurality of output streams, each of said output streams being produced by processing respective input signals under test (SUT) according to said steps of sampling, filtering and combining.

16. The method of claim 14, wherein:
each of said temporally staggered and overlapping setup and hold windows comprise respective time periods established by a respective clock signal, each respective clock signal being delayed in phase with respect to an adjacent clock signal by an amount of time determined according to the number of windows used.

* * * * *